United States Patent
Park

[11] Patent Number: 5,990,700
[45] Date of Patent: Nov. 23, 1999

[54] INPUT BUFFER CIRCUIT AND METHOD

[75] Inventor: Chun Seong Park, Choongcheongbuk-Do, Rep. of Korea

[73] Assignee: LG Semicon Co., Ltd., Cheongju, Rep. of Korea

[21] Appl. No.: 08/955,567

[22] Filed: Oct. 22, 1997

[30] Foreign Application Priority Data

Oct. 29, 1996 [KR] Rep. of Korea .................. 96-49454

[51] Int. Cl.⁶ ................................................. H03K 17/16
[52] U.S. Cl. ........................ 326/22; 326/62; 327/197; 327/333
[58] Field of Search .................. 326/22, 23, 24, 326/26, 27, 82, 83, 62; 327/333, 197, 227, 108

[56] References Cited

U.S. PATENT DOCUMENTS

| | | | |
|---|---|---|---|
| 4,581,545 | 4/1986 | Beale et al. | 307/290 |
| 5,027,053 | 6/1991 | Ohri et al. | 323/314 |
| 5,512,853 | 4/1996 | Ueno et al. | 327/333 |
| 5,808,477 | 9/1998 | Gola et al. | 326/9 |

*Primary Examiner*—Huan Hoang
*Assistant Examiner*—David Lam
*Attorney, Agent, or Firm*—Fleshner & Kim

[57] ABSTRACT

An input buffer circuit includes a plurality of paths having a different threshold voltage, respectively, a comparator for comparing an output value of the paths, a switch for determining operation of the input buffer circuit based on an output value of the comparator, and a latch coupled to the switch. The input buffer circuit and method for using same maintains a previous output value to improve a noise margin of the input buffer circuit and to improve the stability of input buffer circuit operation.

25 Claims, 2 Drawing Sheets

FIG. 1
BACKGROUND ART
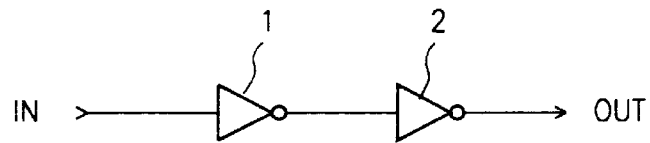
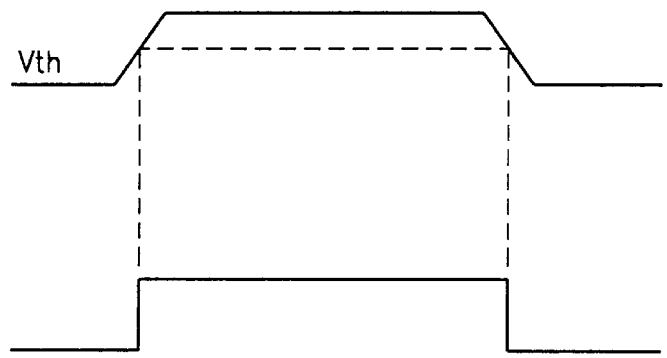
FIG.2A
BACKGROUND ART
FIG.2B
BACKGROUND ART
FIG. 3
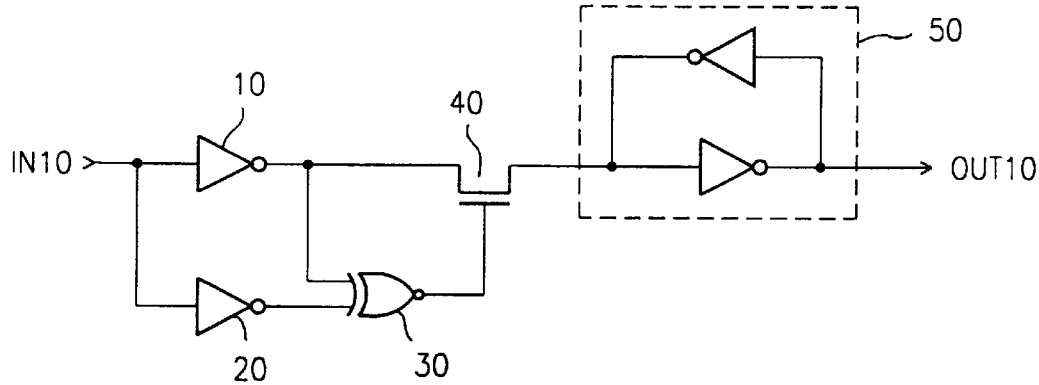

INPUT BUFFER CIRCUIT AND METHOD

BACKGROUND OF THE INVENTION

1. Field of the Invention

The present invention relates to an input buffer circuit, and more particularly, to an input buffer circuit that improves a noise margin.

2. Background of the Related Art

As shown in FIG. 1, in a related art input buffer circuit there are serially connected a plurality of inverters 1, 2 between an input terminal IN and an output terminal OUT. The input buffer circuit compares a logic threshold voltage Vth and an input voltage and outputs the resultant value. That is, as shown in FIG. 2A, when the input voltage IN is lower than that of the logic threshold voltage Vth, the inverter 1 recognizes the input value as a low level and outputs a high level signal. Accordingly, the output signal OUT becomes low level because of the inverter 2 as shown in FIG. 2B.

To the contrary, as shown in FIG. 2A, when the input voltage IN is higher than that of the logic threshold voltage Vth, the inverter 1 recognizes the input value as a high level and outputs a low level signal. Accordingly, the output signal OUT becomes a high level because of the inverter 2 as shown in FIG. 2B.

However, in the related art input buffer circuit, when an input voltage is converted around a logic threshold voltage, the input circuit does not exactly recognize the input voltage as an appropriate high or low level. In this case, the operation of the input circuit becomes unstable and accordingly incurs noise.

SUMMARY OF THE INVENTION

It is an object of the present invention to solve at least the above-described problems and disadvantages of the related art.

It is another object of the present invention to provide an input buffer circuit and method for obtaining an improved noise margin. It is yet another object of the present invention to provide an input buffer circuit having an improved noise margin by composing a plurality of paths with differing logic threshold voltages and disregarding an input signal variation between the plurality of logic threshold voltages.

To achieve the at least the above-described objects in whole or in part, the input buffer circuit includes a plurality of paths each having a different threshold voltage, a comparator for comparing an output value of the paths, a switch for determining operation of the input buffer circuit based on an output value of the comparator, and a latch coupled to the switch.

To achieve the at least the above-described objects in whole or in part, a method for operating an input buffer circuit includes applying a first signal to a plurality of paths, wherein each path has a different threshold voltage; comparing an output value of each of the plurality of paths and outputting a second signal; and determining an operation of the input buffer circuit based on the second signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 1 is a schematic diagram showing a related art input buffer circuit;

FIG. 2A is a diagram showing timing of an input signal in FIG. 1;

FIG. 2B is a timing diagram showing timing of an output signal in FIG. 1;

FIG. 3 is a schematic diagram showing a preferred embodiment of an input buffer circuit according to the present invention;

DETAILED DESCRIPTION OF PREFERRED EMBODIMENTS

Figure 4A:
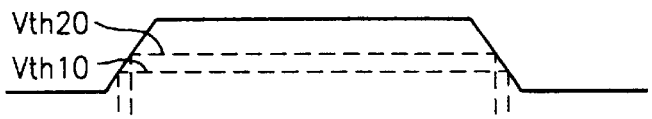
FIG. 4A is a diagram showing timing of an input signal in FIG. 3.

As shown in FIG. 3, a preferred embodiment of an input buffer circuit according to the present invention includes a path 10 having a threshold voltage Vth1, a path 20 coupled in parallel to the path 10 with a threshold voltage Vth2 different from the path 10, a comparator 30 for comparing the output value of the path 10 and the output value of the path 20, a switch 40 and a latch 50 coupled to the switch 40. The switch 40 determines operation of the input circuit based on the output value of the comparator 30.

As shown in FIG. 3, the plurality of paths 10, 20 are respectively composed of a plurality of inverters 10, 20 that invert or non-invert an input signal based on an input signal level. The comparator 30 compares the output values of the paths 10, 20 for example. Further, the comparator includes an exclusive NOR gate 30 for exclusively NORing the output value of the inverters 10, 20 and the switch 40 is composed of an NMOS transistor 40. However, the present invention is not intended to be limited to this. A combination of logic gates that performs the function of comparing an input signal to various thresholds can be used. Further, the preferred embodiment shown in FIG. 3 uses two paths. However, the invention is not intended to be limited to this. For example, three paths or combinations having different thresholds could be used.

Operations of the preferred embodiment of the input buffer circuit will now be described.

First, the inverter 10 has the logic threshold voltage Vth10 and the inverter 20 has the logic threshold voltage Vth20. Further, the logic threshold voltage Vth20 is preferably greater than the logic threshold voltage Vth10.

Figure 4B:
FIG. 4B is a diagram showing timing of an output signal of an inverter in FIG. 3.
Figure 4C:
FIG. 4C is a diagram showing timing of an output signal of another inverter in FIG. 3.

When an input voltage IN10 is lower than the logic threshold voltage Vth10 as shown in FIG. 4A, the inverter 10 recognizes the input voltage IN10 as a low level. Thus, as shown in FIG. 4B, a high level signal is output. Further, when the input voltage IN10 is lower than the logic threshold voltage Vth20, the inverter 20 outputs a high level signal as shown in FIG. 4C.

Figure 4D:
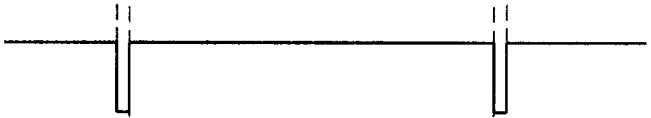
FIG. 4D is a diagram showing timing of an output signal of an exclusive NOR gate in FIG. 3.
Figure 4E:
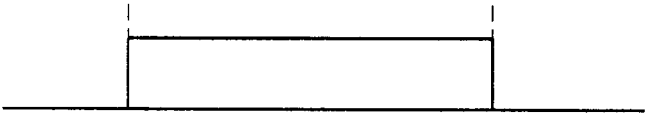
FIG. 4E is a diagram showing timing of an output signal of a latch in FIG. 3.

When the input voltage IN10 is lower than both the logic threshold voltages Vth10, Vth20, the exclusive NOR gate 30 outputs a high level signal in accordance with the output values of the inverters 10, 20 as shown in FIG. 4D. The gate of the NMOS transistor 40 receives the high level output value and is enabled so that the output of the high level inverter 10 is transmitted to the latch 50. Thus, the latch 50 outputs a low level signal in accordance with an inverter of the latch 50 as shown in FIG. 4E.

Second, when the input voltage IN10 remains at a level between the logic threshold voltages Vth10, Vth20, the inverter 10 recognizes the input voltage as a high level signal and outputs a low level signal as shown in FIG. 4B. However, when the input voltage IN10 remains lower than the logic threshold voltage Vth20, the inverter 20 recognizes the input voltage IN10 as a low level and outputs a high level as shown in FIG. 4C.

Accordingly, the output of the exclusive NOR gate 30 is turned to a low level in accordance with the output values of the low level from the inverter 10 and the high level from the inverter 20 as shown in FIG. 4D. At this time, a lower level signal serving as an output value of the exclusive NOR gate 30 is applied to the gate of the NMOS transistor 40. The NMOS transistor 40 is not turned on and the output signal OUT10 retains a previous output value (e.g., low) as shown in FIG. 4E.

Third, when the input voltage IN10 is higher than both the logic threshold voltages Vth10, Vth20, the inverters 10, 20 recognize the input voltage IN10 as a high level signal and each output a low level signal, as shown in FIGS. 4B and 4C. Then, the exclusive NOR gate 30 outputs a high level signal as shown in FIG. 4D. The NMOS transistor 40 is enabled in accordance with a high level signal serving as an output value of the exclusive NOR gate 30 and outputs a high level signal inverted from the low level output signal of the inverter 10.

Fourth, when the input voltage IN10 decreases to again be between the logic threshold voltages Vth10, Vth20, the output retains the previous output value as shown in FIG. 4E, based on the inverters 10, 20 and the exclusive NOR gate 30 and the NMOS transistor 40.

That is, when the input voltage IN10 is converted from a high to a low level, the input voltage IN10 transitions temporarily between the logic threshold voltage Vth10 of the inverter 10 and the threshold voltage Vth 20 of the inverter 20. At this time, the output value of the inverter 10 and the output value of the inverter 20 become different from each other. Thus, the output value of the exclusive NOR gate 30 is turned to a low level. Accordingly, the NMOS transistor 40 becomes an open circuit and the output signal OUT10 retains the previous output value.

As described above, the preferred embodiment controls the logic threshold voltages Vth10, Vth20 of the inverters 10, 20 and can ignore variations of an unstable input voltage, and in particular, relative to an input value between the logic threshold voltages Vth10, Vth20. Further, the preferred embodiment maintains the previous output value as an input signal transitions, which improves the stability and increases a noise margin of the input buffer circuit.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. An input buffer circuit, comprising:
a plurality of paths each having a different threshold voltage;
a comparator that compares an output value of each of the plurality of paths; and
a switch that determines an operation of the input buffer circuit based on an output value of the comparator, wherein each of said plurality of paths include at least one logic gate which logically processes an input signal based on a level of the input signal.

2. The input buffer circuit of claim 1, further comprising a latch coupled to the switch.

3. The input buffer circuit of claim 1, wherein the at least one logic gate is an inverter.

4. The input buffer circuit of claim 1, wherein the comparator includes an exclusive NOR gate for exclusively NORing the respective output values of the paths.

5. The input buffer circuit of claim 1, wherein the switch includes a transistor.

6. The input buffer circuit of claim 5 wherein the transistor has a control electrode receiving the output value of the comparator, a first electrode coupled to a lowest threshold voltage path of the plurality of paths and a second electrode coupled to a latch.

7. The input buffer of claim 6, wherein the transistor is an NMOS transistor, and wherein the first, second and control electrodes are a source, a drain and a gate, respectively.

8. The input buffer circuit of claim 1, wherein when an input voltage is between the logic threshold voltages of the paths, the switch is turned off based on the output value of the comparator to maintain a previous output value of the input buffer circuit.

9. The input buffer circuit of claim 8, wherein the previous value is determined by at least one differing output value of the plurality of paths.

10. A method for operating an input buffer circuit, comprising the steps of:
applying a first signal to a plurality of paths, wherein each path has a different threshold voltage;
comparing an output value of each of the plurality of paths to generate a second signal; and
determining an operation of the input buffer circuit based on the second signal, wherein when an input voltage is between the threshold voltages of the paths, the comparing step is suspended to maintain a previous second signal.

11. The method of claim 10, further comprising latching an output value of one path of the plurality of paths.

12. The method of claim 10, wherein said each of the plurality of paths comprises at least one logic gate.

13. The method of claim 10, wherein said each of the plurality of paths comprises at least one inverter.

14. The method of claim 10, wherein the previous second signal is determined based on a lowest threshold value path of the plurality of paths.

15. An input buffer circuit, comprising:
a plurality of paths each having a different threshold voltage;
a comparator that compares an output value of each of said plurality of paths; and
a switch that determines an operation of the input buffer circuit based on an output value of said comparator, wherein said switch includes a transistor having a control electrode coupled to receive an output of said comparator, a first electrode coupled to a lowest threshold voltage path of said plurality of paths and a second electrode coupled to a latch.

16. The input buffer circuit of claim 15, wherein each of said plurality of paths includes at least one inverter for inverting an input signal based on a level of the input signal.

17. The input buffer circuit of claim 15, wherein the comparator includes a logic gate for logically processing the respective output values of each of said plurality of paths.

18. The input buffer circuit of claim 15, wherein when an input voltage is between the threshold voltages of the paths, said switch is turned off based on the output value of said comparator to maintain a previous output value of the input buffer circuit.

19. The input buffer of claim 15, wherein the transistor is an NMOS transistor, and wherein the first, second and control electrodes are a source, a drain and a gate, respectively.

20. An input buffer circuit, comprising:
- a plurality of paths each having a different threshold voltage;
- a comparator that compares an output value of each of said plurality of paths; and
- a switch that determines an operation of the input buffer circuit based on an output value of said comparator, wherein said comparator includes an exclusive NOR gate for exclusively NORing the respective output values of each of said plurality of paths.

21. The input buffer circuit of claim 20, further comprising a latch coupled to said switch.

22. The input buffer circuit of claim 20, wherein said each of said plurality of paths includes at least one inverter for logically processing an input signal based on a level of the input signal.

23. The input buffer circuit of claim 20, wherein said switch includes a transistor having a control electrode coupled to receive the output value of said comparator, a first electrode coupled to a lowest threshold voltage path of said plurality of paths and a second electrode coupled to a latch.

24. A method for operating an input buffer circuit, comprising the steps of:
- applying a first signal to a plurality of paths, wherein each path has a different threshold voltage;
- comparing an output value of each of the plurality of paths to generate a second signal; and
- determining an operation of the input buffer circuit based on the second signal, wherein said each of the plurality of paths comprises at least one logic gate.

25. A method for operating an input buffer circuit, comprising the steps of:
- applying a first signal to a plurality of paths, wherein each path has a different threshold voltage;
- comparing an output value of each of the plurality of paths to generate a second signal; and
- determining an operation of the input buffer circuit based on the second signal, wherein each of the plurality of paths comprises at least one inverter.

* * * * *